United States Patent
Giduturi et al.

(10) Patent No.: US 12,008,236 B2
(45) Date of Patent: Jun. 11, 2024

(54) TUNED DATAPATH IN STACKED MEMORY DEVICE

(71) Applicant: Micron Technology, Inc., Boise, ID (US)

(72) Inventors: Hari Giduturi, Folsom, CA (US); Bret Addison Johnson, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/461,035

(22) Filed: Aug. 30, 2021

(65) Prior Publication Data

US 2023/0063347 A1 Mar. 2, 2023

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
CPC ....... G06F 3/061; G06F 3/0655; G06F 3/0679
See application file for complete search history.

(56) References Cited

U.S. PATENT DOCUMENTS

| | | | | |
|---|---|---|---|---|
| 2011/0050303 A1* | 3/2011 | Ma | ............................ | G11C 5/02 327/158 |
| 2011/0194326 A1* | 8/2011 | Nakanishi | ............ | H01L 25/0657 365/51 |
| 2011/0286254 A1 | 11/2011 | Yu et al. | | |
| 2016/0117101 A1* | 4/2016 | Choi | ..................... | G06F 3/0688 711/105 |
| 2016/0124873 A1 | 5/2016 | Xu et al. | | |
| 2017/0133070 A1 | 5/2017 | Ware et al. | | |
| 2018/0315469 A1 | 11/2018 | Uemura | | |
| 2019/0102298 A1* | 4/2019 | Hasbun | .............. | G11C 13/0038 |
| 2019/0206450 A1* | 7/2019 | Contreras | ............... | H01L 24/02 |
| 2019/0304512 A1* | 10/2019 | Narui | ..................... | G11C 5/025 |
| 2020/0111523 A1* | 4/2020 | Lee | ..................... | H01L 25/0652 |

OTHER PUBLICATIONS

International Search Report and Written Opinion for PCT Application No. PCT/US2022/035214, dated Oct. 21, 2022, 9 Pages.
Taiwanese Office Action for TW Application No. 111127703, dated May 11, 2023, 11 Pages.

* cited by examiner

*Primary Examiner* — Zhuo H Li
(74) *Attorney, Agent, or Firm* — Fletcher Yoder, P.C.

(57) ABSTRACT

A device includes a first memory die and a second memory die directly coupled to the first memory die via a first bus. The device also includes a second bus directly coupled to the first memory die. The first memory die includes a first trim circuit that when in operation adjusts a delay of signal transmission by the first memory die to a first value, while the second memory die comprises a second trim circuit that when in operation adjusts a delay of signal transmission by the second memory die to a second value.

18 Claims, 4 Drawing Sheets

TUNED DATAPATH IN STACKED MEMORY DEVICE

BACKGROUND

Field of the Present Disclosure

Embodiments of the present disclosure relate generally to the field of semiconductor devices. More specifically, embodiments of the present disclosure relate to stacked memory on a memory die.

Description of Related Art

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light and not as admissions of prior art.

Generally, a computing system includes processing circuitry, such as one or more processors or other suitable components, and memory devices, such as chips or integrated circuits. One or more memory devices may be used on a memory module, such as a dual in-line memory module (DIMM), to store data accessible to the processing circuitry. For example, based on a user input to the computing system, the processing circuitry may request that a memory module retrieve data corresponding to the user input from its memory devices. In some instances, the retrieved data may include instructions executable by the processing circuitry to perform an operation and/or may include data to be used as an input for such operation. In addition, in some cases, data output from the operation may be stored in memory, such as to enable subsequent retrieval of data from the memory.

Some memory devices include memory cells that may be accessed by turning on a transistor that couples the memory cell (e.g., a capacitor) with a word line or a bit line. In contrast, threshold-type memory devices may include memory devices that are accessed by providing a voltage across a memory cell, where the data value is stored and/or retrieved based on the threshold voltage of the memory cell. For example, the data value may be based on whether the threshold voltage of the memory cell is exceeded and, in response to the voltage provided across the memory cell, the memory cell conducts current. The data value stored may be changed, such as by applying a voltage sufficient to change the threshold voltage of the memory cell. Moreover, the data value may be retrieved (i.e., read) by applying sufficient voltage to allow access to the stored voltage of the memory cell. One example of a threshold-type memory cell may be a cross-point memory cell (Xpoint memory cell).

Gains in memory density have been achieved through the inclusion of additional memory on a given die. One technique to increase density of a memory die includes the stacking of memory into a stacked array. However, as additional memory is added to a device and/or stacked, it becomes more difficult to properly align signals transmitted to and/or received from the memory. Accordingly, it would be advantageous to overcome signaling delay issues in dense memory dies, for example, dies having stacked memory thereon.

DETAILED DESCRIPTION

Figure 1:
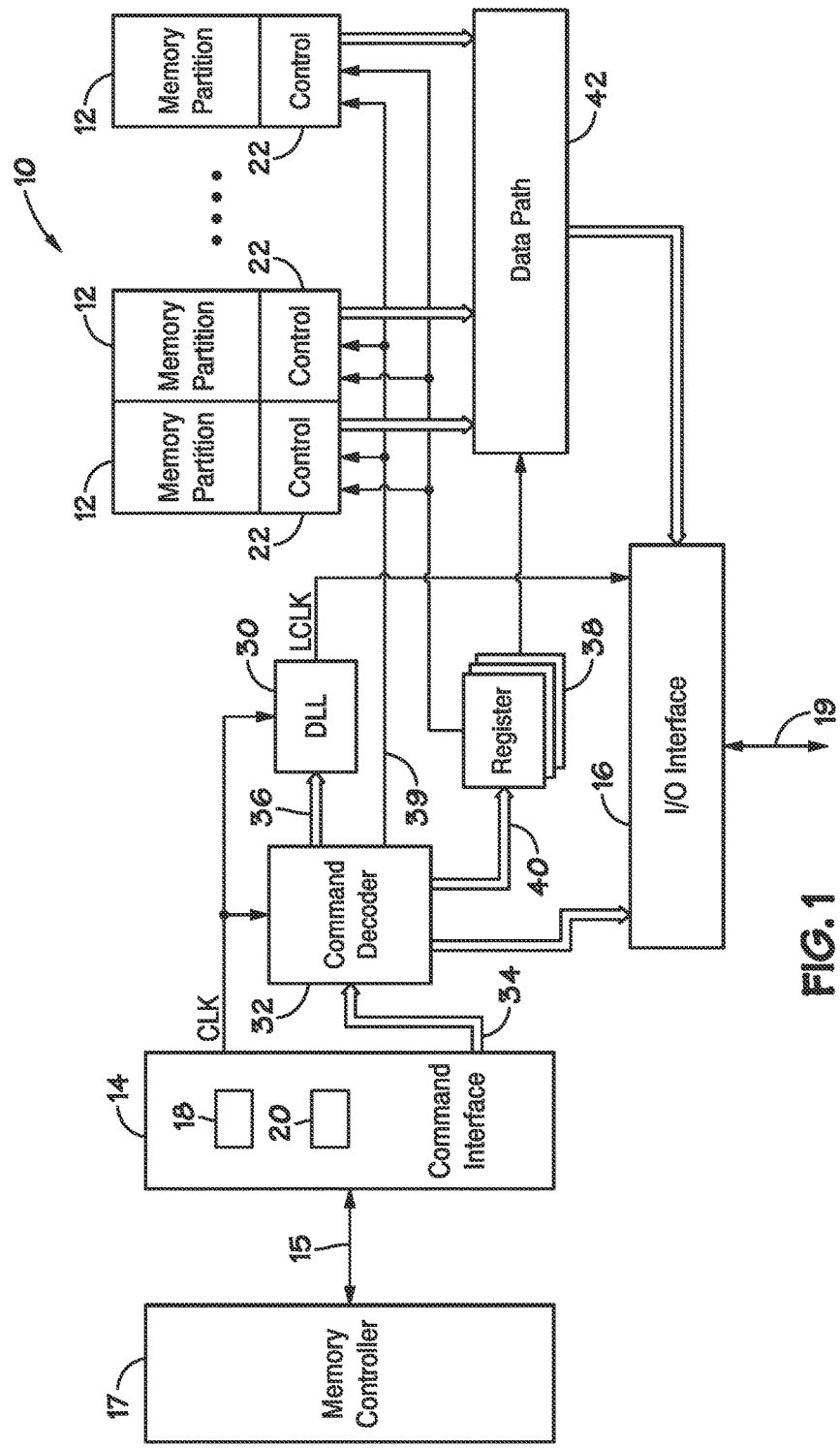
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As memory densities continue to increase, one potential solution to increase memory capacity of a memory device is to utilize stacked memory, for example, in a single package. However, to maintain high throughput, it can be beneficial for a front end interface path between a host and a memory device to be fully saturated at a maximum interface speed capability of the memory device. With multi-die memory stacks, this can be difficult. Accordingly, in some embodiments, the stacked memory (e.g., memory stacks) can include a primary memory die and one or more secondary memory dies. Intra-die communication between the primary memory die and the secondary memory dies is kept internal to package and the host only directly interfaces with the primary memory die of the memory stack (i.e., the host does not see or directly communicate with the secondary memory dies of the memory stack, the primary memory die communicates with the external host). Internal buses and or paths between the primary memory die and the internal (secondary) dies are completely internal to the package (i.e., the memory device).

However, as there are increases in the stack height (e.g., the number of memory dies in a stack), additional issues may arise. For example, internal connection delay (e.g., bond wire delay) between the primary memory die and one or more secondary memory dies (e.g., the secondary farthest in distance from the primary memory die) can be substantial, and can effect clocking of signals into and/or out of the secondary memory. Likewise, it can happen that the different die in the memory stack are from different skew corners, which can lead to differences in, for example, complementary metal-oxide-semiconductor (CMOS) process times. Furthermore, timing of the flow of signals (e.g., data) on the internal buses in relation to external interface speed can overlay (due to variable delays in the memory stack), which can cause timing failures due to signal collisions (e.g., timings of data packets will not be in sync with the interface clock). In short, as memory stacks are employed, there can be resultant delays due to, for example, the position of the dies in the package and CMOS process skew of the memory dies.

Accordingly, present embodiments allow for de-skewing of the delays to generate a consistent overall delay. This ensures that all secondary memory dies in package, including the secondary memory die farthest in distance from the primary memory die in the stack, operates with the same net delay (e.g., the same net timing delay). In some embodiments, the signal path may be automatically tuned (e.g., self-tuned). Likewise, the signal path may be tuned via a user during or after manufacture of the memory device. By adjusting the overall delay and/or the individual delays of the memory dies of the memory stack, timing issues, signal collisions, and the like can be minimized and/or otherwise alleviated.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device (including a double data rate SRAM device), flash memory, and/or a phase change memory (PCM) device and/or other chalcogenide-based memory, such as self-selecting memories (SSM). Moreover, the memory cells of the memory device can each have a corresponding logic storing device (e.g., a capacitor, a resistor, or the resistance of the chalcogenide material(s)).

In some embodiments, when the memory device 10 is a PCM device, it may be a 3D XPoint memory device as a non-volatile memory that utilizes chalcogenide material(s) to allow for state changes of memory cells therein. The changing of one state to another, for example, a crystalline phase (e.g., an orderly phase of the material of the memory cells of the PCM device) having a relative low resistance to an amorphous phase (e.g., a disorderly phase of the material of the memory cells of the PCM device) having relative high resistance may be controlled through the application of, for example, heat to the materials of the PCM. The states themselves, based on their differences in resistivity, represent whether the phase change memory cell stores "1" or "0" as a binary value.

The memory device 10 may include a number of memory partitions 12 each inclusive of one or more arrays (i.e., memory arrays). Various configurations, organizations, and sizes of the memory partitions 12 on the memory device 10 may be utilized depending on the application and design of the overall system. The memory device 10 may also include a command interface 14 and an input/output (I/O) interface 16. The command interface 14 is configured to provide a number of signals from an external device, such as a processor or controller (e.g., memory controller 17) external to the memory device 10. In some embodiments, a bus 15 (or a signal path or another group of signal paths) may, individually or in combination, allow for bidirectional transmission of signals between the command interface 14 and the processor or controller (e.g., the memory controller 17). Likewise, a bus 19 (or a signal path or another group of signal paths) may, individually or in combination, allow for bidirectional transmission of signals, including, for example, data signals, between the I/O interface 16 and, for example, the processor or controller (e.g., the memory controller 17). Thus, the processor or controller, for example, the memory controller 17 may provide various signals to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the received signals. The command interface 14 may receive one or more clock signals from an external device, such as a processor or controller (for example, the memory controller 17). Likewise, the command interface receives commands (e.g., read command, write command, etc.), which may be entered on the positive edges of the clock signal, as well as data, which typically is transmitted or received on both positive and negative clock edges. In some embodiments, the commands can be of a variable clock length (e.g., one or more clocks are used to receive the commands).

The clock input circuit 18 receives the one or more clock signals and generates an internal clock signal CLK therefrom. In some embodiments, the internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, register set commands, activate commands, etc., and provide access to a particular memory partition 12 corresponding to the command, via bus path 39. The command decoder 32 may also transmit various signals to one or more registers 38 via, for example, bus path (e.g., one or more global wiring lines 40). As will be appreciated, the memory device 10 may include various other decoders, such as row decoders and column decoders, to facilitate access to the memory partitions 12. In one embodiment, each memory partition 12 includes a control block 22 which provides the necessary decoding (e.g., row decoder and column decoder), as well as other features, such as timing control and data control, to facilitate the execution of commands to and from the memory partitions 12.

In certain embodiments, the command decoder 32 or other component in the memory device 10 may provide register commands to the one or more registers 38, which may be utilized in operations of each memory partition 12, each control block 22 (or partition controller therein), and the like. For example, one of the one or more registers 38 may operate to define various modes of programmable operations and/or configurations of the memory device 10. Registers 38 can be included in semiconductor devices to define operations for various types of memory components, such as DRAM, synchronous DRAM, chalcogenide memories (e.g., PCM) or other types of memories. The one or more registers 38 may receive various signals from the command decoder 32 or the like via global wiring lines 40. The global wiring lines 40 may include a common data path, a common address path, a common write command signal path, and a common read command signal path. The global wiring lines 40 may traverse across the memory device 10, such that each register 38 may couple to the global wiring lines 40. The additional registers may involve additional wiring across the semiconductor device (e.g., die), such that the registers are communicatively coupled to the corresponding memory components.

The one or more registers 38 operate as an example of registers that, when in operation, are accessed or otherwise accessible by the memory controller 17. The registers accessible by the memory controller 17 can be dispersed across the memory device 10 and the these registers can represent or contain information such as configuration settings of the memory device 10 and/or specific components therein, status of the memory device 10 and/or specific components therein, memory device 10 parameters and/or specific parameters for components of the memory device 10, as well as predetermined patterns that can be written across the memory device (e.g., in one or more of the memory partitions 12). Thus, while the one or more registers 38 is illustrated in FIG. 1, it should be appreciated that additional and/or alternative registers are located in the memory device and these registers are accessible by the memory controller 17 (i.e., when in operation, the registers are accessed by the memory controller 17). These accesses by the memory controller 17 may include, for example, reads of the registers (e.g., read accesses) and/or writes to the registers (e.g., write accesses).

The memory device 10 executes operations, such as read commands and write commands, based on the command/address signals received from an external device, such as a processor and/or by the memory controller 17. In one embodiment, command/address signals are clocked to the command interface 14 using clock signals. The command interface may include a command address input circuit 20 which is configured to receive and transmit the commands to provide access to the memory partitions 12, through the command decoder 32, for instance. In addition, the command interface 14 may receive memory select signals that enable the memory device 10 to process commands on the incoming command/address signals. Access to specific memory partitions 12 within the memory device 10 can be encoded in the commands.

In addition, the command interface 14 may be configured to receive a number of other command signals. For instance, a reset command may be used to reset the command interface 14, status registers, state machines and the like, during power-up for instance. Various signals to facilitate testing of the memory device 10 may be provided, as well. For instance, the testing signals may be used to place the memory device 10 into a test mode for connectivity testing. The command interface 14 may also be used to provide an alert signal or another alarm signal to the system processor or controller for certain errors that may be detected. However, in some embodiments, the I/O interface 16 may additionally or alternatively be utilized to transmit an alert signal, for example, a thermal alert.

Data may be sent to and from the memory device 10, utilizing the command and clocking signals discussed above, by transmitting and receiving data signals through the I/O interface 16. More specifically, the data may be sent to or retrieved from the memory partitions 12 over the data path 42, which includes a plurality of bi-directional data buses. Data I/O signals, are generally transmitted and received in one or more bi-directional data busses to and from the I/O interface 16. For certain memory devices, such as a DDR5 SDRAM memory device, the I/O signals may be divided into upper and lower bytes; however, such segmentation is not required for other memory device types.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
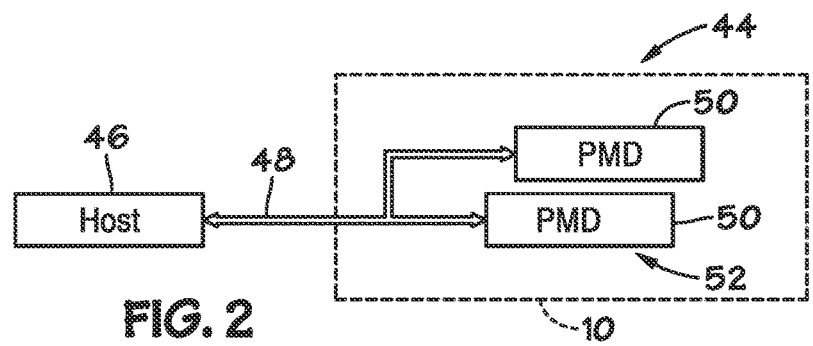
FIG. 2 illustrates a simplified diagram illustrating the memory device of FIG. 1 having a first example of a memory stack, according to an embodiment of the present disclosure.

FIG. 2 illustrates a diagram 44 of memory stacking in the memory device 10. As illustrated, a host device 46 (i.e., memory controller 17 or a CPU in the host device) transmits commands and/or data to the memory device 10 via a front end interface path 48, which may be one or more of the bus 15 and the bus 19 described above. In this manner, the front end interface path 48 operates as a command and/or data input output pathway (e.g., a bus or a signal path or another group of signal paths). Furthermore, as illustrated in FIG. 2, each memory die 50 may be stacked into a memory stack 52 (e.g., a 3D memory stack) so that multiple memory dies 50 are present in the memory device 10 in with a reduced footprint on the package of the memory device 10.

Figure 3:
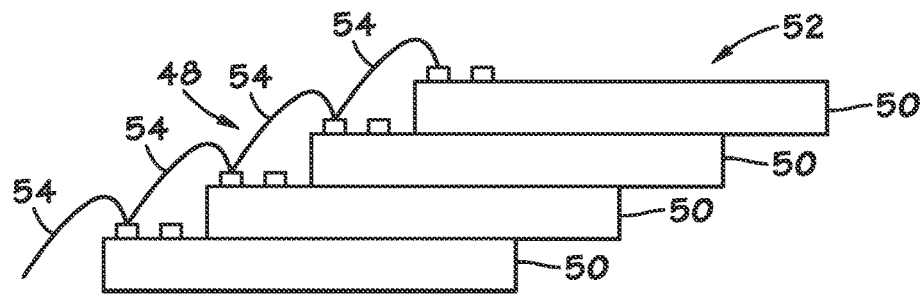
FIG. 3 illustrates a simplified diagram of the memory stack of FIG. 2, according to an embodiment of the present disclosure.

FIG. 3 illustrates an example of the memory stack 52 in which the front end interface path is coupled to each of the memory dies 50. One or more connections (e.g., bond wires 54, through silicon vias (TSVs), or the like) may be utilized to extend the front end interface path to each of the memory dies 50. As illustrated, this forms a cascade connection, however, it should be noted that one or more direct connections for each bond wire 54 can instead be coupled to a substrate, whereby the bond wires 54 are not directly coupled to other memory dies 50 in the memory stack 52. Likewise, a combination of these two wiring techniques may be employed in connecting the memory dies 50 of the memory stack 52 to the front end interface path 48.

In the configuration illustrated in each of FIGS. 2 and 3, the input command/control/address (as well as the data pins)

of the memory device are shared across the memory dies 50 of the memory stack 52. However, this configuration can operate to reduce the net interface speed capability of the memory device 10 as a function of the height of the memory stack 52 (e.g., the number of memory dies 50 in the stack utilizing the shared front end interface path 48 with each memory die 50 operating as a primary die).

Figure 4:
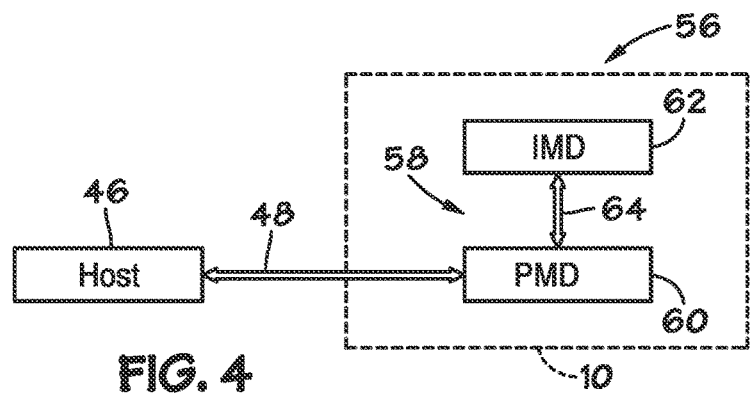
FIG. 4 illustrates a simplified diagram illustrating the memory device of FIG. 1 having a second example of a memory stack, according to an embodiment of the present disclosure.

Accordingly, FIG. 4 illustrates a diagram 56 of a second technique of memory stacking in the memory device 10. As illustrated, the host device 46 (i.e., memory controller 17 or a CPU in the host device) transmits commands and/or data to the memory device 10 via the front end interface path 48, which may be one or more of the bus 15 and the bus 19 described above. Furthermore, as illustrated in FIG. 4, a memory stack 58 is made up of a primary memory die 60 (similar to memory die 50), as well as one or more secondary memory dies 62 stacked thereon. Additionally, as illustrated, the front end interface path 48 is connected to the primary memory die 60 and a second path and/or path array (e.g., a back end interference path 64) is coupled between the primary memory die 60 and the one or more secondary memory dies 62. This configuration is further illustrated in FIG. 5.

Figure 5:
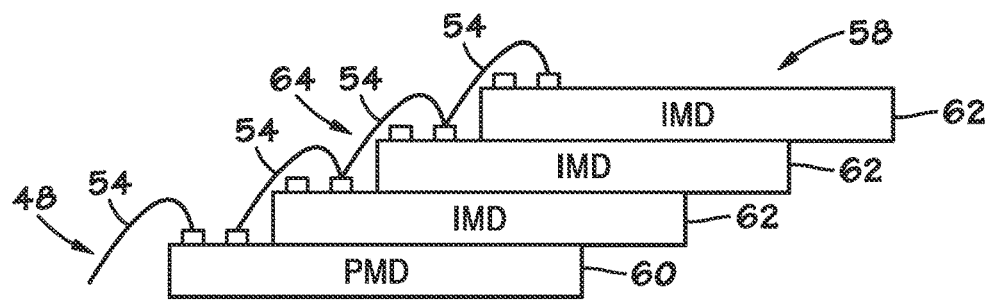
FIG. 5 illustrates a simplified diagram of the memory stack of FIG. 4, according to an embodiment of the present disclosure.

FIG. 5 illustrates the memory stack 58 inclusive of the primary memory die 60 and secondary memory dies 62 stacked thereon. While the memory stack is illustrated as including a primary memory die 60 and three secondary memory dies 62 stacked thereon, it should be appreciated that the primary memory die 60 can be placed in a different location in the memory stack 58. Likewise, it should be appreciated that more or less secondary memory dies 62 may be employed, for example, 1, 2, 3, 7, 11, 15 or another number of secondary memory dies 62 in addition to the primary memory die 60 of the memory stack 58. In some embodiments, the primary memory die 60 and the secondary memory die 62 can be part of the same or different silicon.

As illustrated, the primary memory die 60 is directly coupled to the front end interface path 48 via, for example, bond wires 54 (or other connection paths). In contrast, the secondary memory dies 62 are coupled to the front end interface path 48 via the primary memory die 60. That is, a bond wire 54 is directly coupled from a first stacked secondary memory die 62 to the primary memory die 60, a second bond wire is directly coupled from the first stacked secondary memory die 62 to a secondary stacked memory die 62, and so on. In this manner, each secondary memory dies 62 receives signals (e.g., command, control, and/or address and/or data signals) from the host device 46 indirectly, as direct communications between the memory stack 58 and the host device 46 are performed by the primary memory die 60. Because the host device 46 is only directly coupled to the primary memory die 60 of the memory stack 58, capacitance due to the secondary memory dies 62 of the memory stack 58 is isolated from the host device 46 and the front end interface path 48. This can allow for increased signal rates (e.g., data rates) along the front end interface path 48 relative to the configuration of the memory device illustrated in FIG. 2.

However, situations may occur in conjunction with the memory stack 58. For example, internal path delay between the primary memory die 60 and the secondary memory die 62 disposed farthest (by distance) from the primary memory die 60 (i.e., the illustrated secondary memory die 62 atop the memory stack 58) can affect signal transmissions relative to, for example, a clock period of the clock utilized in conjunction with the front end interface path 48. Likewise, in some cases, different dies may be used in manufacturing one or more of the primary memory die 60 and the one or more secondary memory dies 62 in the memory, which can lead to differences in, for example, complementary metal-oxide-semiconductor (CMOS) process of the memory dies 60 and 62 in the memory stack 58. Accordingly, positional differences and/or CMOS process skew (or other factors) of the memory dies 60 and 62 in the memory stack 58 can result in differences in delays between one or more of the memory dies 60 and 62 of the memory stack 58 as well as, for example, signal collisions along the back end interference path 64.

Figure 6:
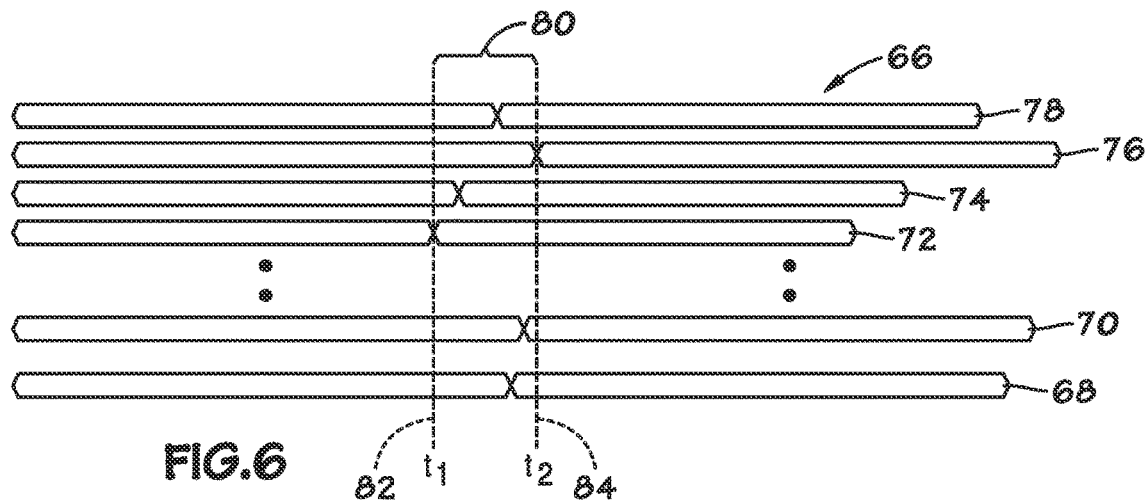
FIG. 6 illustrates a timing diagram of the operation of the memory stack of FIG. 4, according to an embodiment of the present disclosure.

FIG. 6 illustrates a timing diagram 66 of the operation of the memory dies 60 and 62 of the memory stack 58 and issues that can arise when their timings are not aligned. Timing diagram 66 includes timing 68 for the primary memory die 60 of the memory stack 58, timing 70 for a secondary memory die 62 (i.e., secondary memory die 62 closest in distance to the primary memory die 60), timing 72 for a secondary memory die 62 (i.e., secondary memory die 62 fourth farthest in distance from the primary memory die 60), timing 74 for a secondary memory die 62 (i.e., secondary memory die 62 third farthest in distance from the primary memory die 60), timing 76 for a secondary memory die 62 (i.e., secondary memory die 62 second farthest in distance from the primary memory die 60), and timing 78 for a secondary memory die 62 (i.e., secondary memory die 62 farthest in distance from the primary memory die 60). As illustrated signal transmissions for each of the timings 68, 70, 72, 74, 76, and 78 occurs in two segments, whereby the length of the segment represents the total time for that respective die. Also illustrated is a timing window 80 that represents the duration during which the signals for each of the timings 68, 70, 72, 74, 76, and 78 overlaps. It is desirable to reduce this overlap (timing window 80) to zero or near zero.

As illustrated, signal transmissions of the secondary memory die 62 fourth farthest in distance from the primary memory die 60 corresponding to timing 72 occur as the fastest case (i.e., at time t1 82) and signal transmissions of the secondary memory die 62 second farthest in distance from the primary memory die 60 corresponding to timing 76 occur as the slowest case (i.e., at time t2 84) of the timing window 80.

Due to the various times at which signal transmissions are completed in timing window 80, timing window 80 represents the period of time in which delays in signal communications and potential signal collisions can occur. For example, delays between the fastest case and the slowest case (illustrated by timing window 80) of, for example, approximately 100 picoseconds or more, are sufficient to cause signal overlaps and disruptions in signal transmissions with the memory stack 58.

To alleviate these issues, the flow of signals in the back end interference path 64 can be timed in relation to the external interface speed (i.e., the speed of the of the front end interface path 48). For example, when a host device 46 transmits signals to the memory device 10, there is a set amount of time for any return signals to be transmitted back from the memory device 10 (e.g., flight time of a signal, which may be an amount of time to complete a memory operation inclusive of the time to transmit any signals related to that operation). Accordingly when the memory dies 60 and 62 of the memory stack 58 are timed to this speed of the front end interface path 48 (i.e., the timing of communications between the host device 46 and the memory device 10), signal collisions and other signal failures due to delays can be eliminated.

Figure 7:
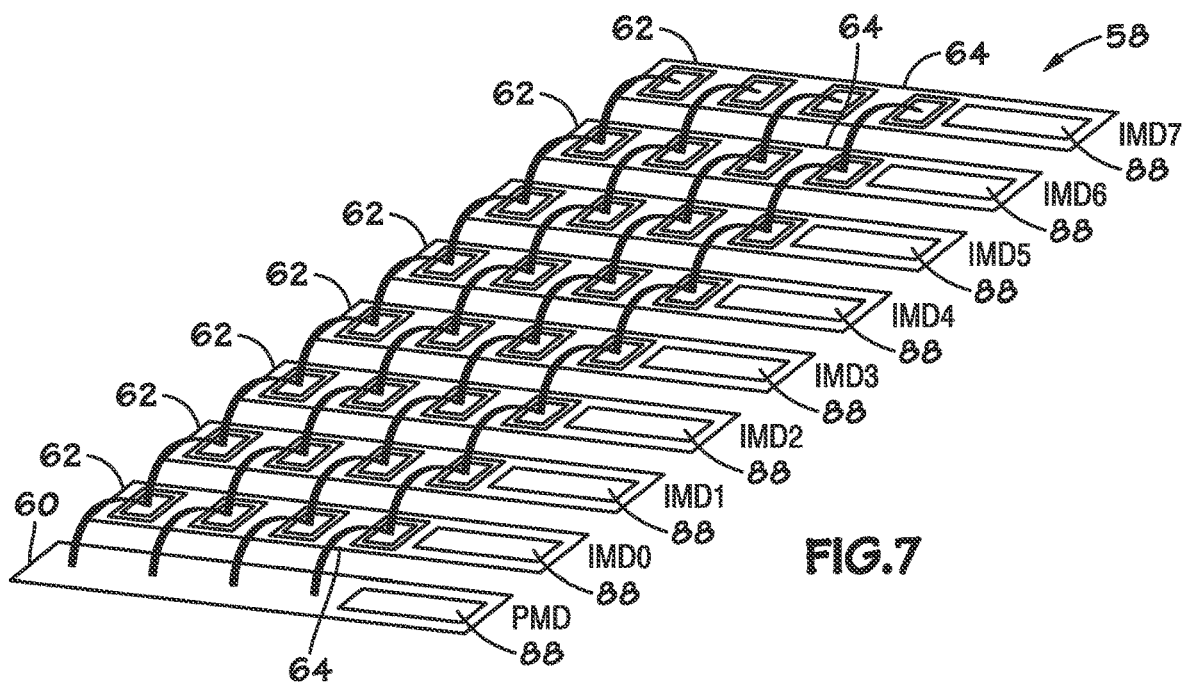
FIG. 7 illustrates a simplified diagram of a second embodiment of the memory stack of FIG. 4, according to an embodiment of the present disclosure.

FIG. 7 illustrates the memory stack 58 inclusive of the primary memory die 60 and secondary memory dies 62 stacked thereon. As illustrated, the primary memory die 60 is labeled PMD (primary memory die), the secondary memory die 62 closest in proximity to the primary memory die 60 is labeled IMD0 (internal memory die 0), the secondary memory die 62 second closest in proximity to the primary memory die 60 is labeled IMD1 (internal memory die 1), the secondary memory die 62 third closest in proximity to the primary memory die 60 is labeled IMD2 (internal memory die 2), the secondary memory die 62 fourth closest in proximity to the primary memory die 60 is labeled IMD3 (internal memory die 3), the secondary memory die 62 fifth closest in proximity to the primary memory die 60 is labeled IMD4 (internal memory die 4), the secondary memory die 62 sixth closest in proximity to the primary memory die 60 is labeled IMD5 (internal memory die 5), the secondary memory die 62 seventh closest in proximity to the primary memory die 60 is labeled IMD6 (internal memory die 6), and the secondary memory die 62 eighth closest (farthest) in proximity to the primary memory die 60 is labeled IMD7 (internal memory die 7). Each of the memory dies 60 and 62 of the memory stack 58 additionally include a trim circuit 88.

In some embodiments, the trim circuit 88 may include, for example, a string of delay elements (e.g., inverters, logic gates, combinatorial logic circuits, and the like) from which a desired number of delay elements or a total amount of signal delay can be selected to and applied to a signal to delay that signal transmitted along the back end interference path 64. Alternatively, the trim circuit may include, for example, one or more clock delay circuits, such as a timing delay generator, combinatorial logic circuits, and/or similar circuitry that can be tuned to provide a particular amount of clock delay associated with transmission of the signals transmitted along the back end interference path 64. Likewise, the trim circuit 88 may include circuit elements of both delay techniques described above to delay the signal and the clock delay associated with transmission of the signals transmitted along the back end interference path 64. Using the trim circuit 88, de-skewing of the delays of individual memory dies 60 and 62 can be adjusted to generate an overall constant delay, thus ensuring that of the memory dies 60 and 62 in the memory stack 58 have the same net timing delay.

In some embodiments, the net timing delay to be set for a respective memory die 60 and 62 can be determined via determination of the slowest path in the memory device (e.g., the maximum delay specific to the package), which may represent the sum of component delay (i.e., the delay of the respective memory die 60, 62) and the bond wire 54 delay for each memory die 60, 62 by position. Likewise, the net timing delay to be applied to a respective memory die 60 and 62 can be determined via the slowest path over the entire process, e.g., the slowest secondary memory die 62 positioned at the farthest distance from the primary memory die 60. Once the net timing delay is determined, each individual memory die 60, 62 can have its delay compared against the calculated net timing delay and the difference in the amount of delay can be determined. This difference in the amount of delay for each memory die 60, 62 can be set and applied via selecting that amount of delay in the trim circuit 88 for each memory die 60, 62 so that each memory die 60, 62 has the same net timing delay.

Figure 8:
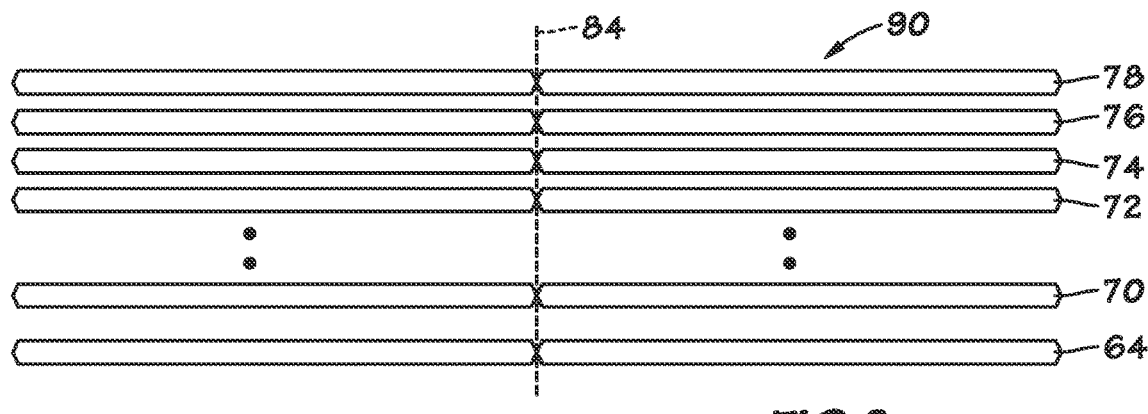
FIG. 8 illustrates a timing diagram of the operation of the memory stack of FIG. 7, according to an embodiment of the present disclosure.

For example, FIG. 8 illustrates a timing diagram 90 in which the timing delays have been trimmed, for example, via the trim circuit 88, for each memory die 60, 62 as described above with respect to FIG. 7. As illustrated, timing diagram 90 of FIG. 8 includes timing 68 for the primary memory die 60 of the memory stack 58, timing 70 for a secondary memory die 62 (i.e., secondary memory die 62, IMD0, that is closest in distance to the primary memory die 60), timing 72 for a secondary memory die 62 (i.e., secondary memory die 62, IMD4, that is the fourth farthest in distance from the primary memory die 60), timing 74 for a secondary memory die 62 (i.e., secondary memory die 62, IMD5, that is third farthest in distance from the primary memory die 60), timing 76 for a secondary memory die 62 (i.e., secondary memory die 62, IMD6, that is second farthest in distance from the primary memory die 60), and timing 78 for a secondary memory die 62 (i.e., secondary memory die 62, IMD7, that is farthest in distance from the primary memory die 60).

In contrast to FIG. 6, the illustrated signal transmissions for each of the timings 68, 70, 72, 74, 76, and 78 in FIG. 8 occur at a common time (i.e., at time t2 84) of the timing window 80 from FIG. 6. That is, the signal transmissions of the secondary memory die 62, IMD6, second farthest in distance from the primary memory die 60 corresponding to timing 76 occur as the slowest case (i.e., at time t2 84) of the timing window 80 and so this delay value is determined to be the net timing delay value for the memory stack 58. The delay value set by the trim circuit 88 of the secondary memory die 62 IMD6 is set to the net timing delay value determined above. Likewise, each of the remaining memory dies 60, 62 (i.e., primary memory 60, secondary memory die 62 IMD0, secondary memory die 62 IMM1, secondary memory die 62 IMD2, secondary memory die 62 IMD3, secondary memory die 62 IMD4, secondary memory die 62 IMD5, and secondary memory die 62 IMD7) has a respective delay value set by the trim circuit 88 of the respective memory die 60, 62 to result in the net timing delay value. In this manner, each memory die 60, 62 of the memory stack 58 has its delay synchronized to the net timing delay value for the memory stack 58 by the trim circuit 88.

Figure 9:
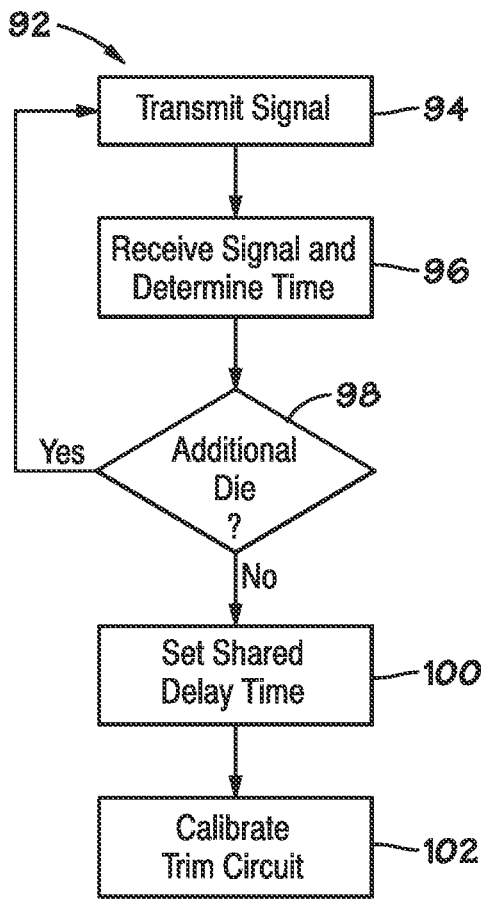
FIG. 9 illustrates a flow chart of a method for setting timing values in the memory stack of FIG. 7, according to an embodiment of the present disclosure.

This process is illustrated in the flow diagram 92 of FIG. 9. In step 94, one or more signals are transmitted to a secondary memory die 62 of the memory stack 58. In step 96, one or more signals are received from the secondary memory die 62 and the duration of time between the transmission of the signal in step 94 and the reception of a return signal in step 96 is determined or otherwise measured. The determination of the duration of time may be part of step 96 or may be performed after step 98 described hereafter. Moreover, the transmission and reception portions of steps 94 and 96 may represent a memory operation at a given memory die 60, 62 inclusive of transmission time and component delay.

In step 98, a determination is made if an additional secondary memory die 62 is in the memory stack 58 to have its timing determined. If another secondary memory die 62 is in the memory stack 58, which has not yet had its signal flight time determined (e.g., an amount of time to complete a memory operation inclusive of the time to transmit any signals related to that operation), the process returns to step 94. However, if no more secondary memory dies 62 are in the memory stack 58 and need to have their signal transmission flight time measured, the process proceeds to step 100.

In step 100, the longest measured time is set as the net timing delay for the memory stack 58. In step 102, each trim circuit 88 is calibrated (e.g., a respective delay value is generated) for each of the secondary memory dies 62 so that the delay value of the trim circuit 88, when added to the timing determined for the respective secondary memory die 62, equals the net timing delay determined in step 100. It should be noted that the process outlined in flow diagram 92 may additionally be applied to the primary memory die 60 in the memory stack 58 so that the primary memory die 60 also has a delay matched to the net timing delay for the memory stack. The process in the flow diagram 92 thus can affect the latency of signals with respect to the memory stack 58, however, the data rate of the memory stack is unchanged once the memory dies 60, 62 are trimmed to have a common net timing delay.

In some embodiments, the process in the flow diagram 92 can be undertaken during product testing, for example, the deskewing parameters are trimmed in-package after the package is assembled or before assembling, as the case maybe. Likewise, each memory die 60, 62 is capable of trimming via the trim circuit 88 to compensate for the maximum delay. This is accomplished through the use of trimming hardware (i.e., via the trim circuit 88) implemented on each memory die 60, 62. Implementation of the process described above can be utilized, when signals are launched onto a shared bus (e.g., back end interference path 64) by different secondary memory dies 62, the signals (e.g., data packets) fall in predetermined timing windows in-sync with the interface clock, and are in-sync with the operation of the primary memory die 60.

Figure 10:
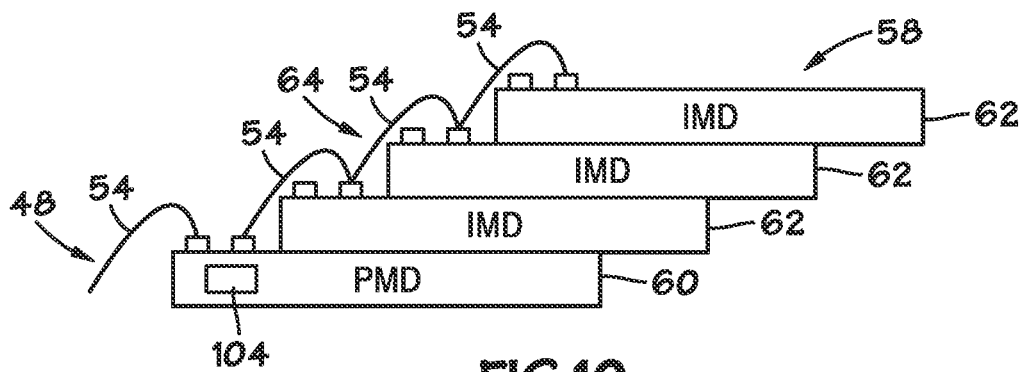
FIG. 10 illustrates a simplified diagram of a third embodiment of the memory stack of FIG. 4, according to an embodiment of the present disclosure.

In some embodiments, it may be preferable to trim the memory dies 60, 62 of the memory stack 58 separately from and/or instead of during product testing. Accordingly, as illustrated in FIG. 10, in some embodiments, a self tuning circuit 104 is included in one or more of the memory dies 60, 62. For example, while the self tuning circuit 104 may be included in each of the memory dies 60, 62, only the self tuning circuit 104 of the primary memory die 60 will be activated. Accordingly, only the self tuning circuit 104 of the primary memory die 60 is illustrated in FIG. 10.

In some embodiments, the self tuning circuit 104 may be, for example, a field programmable gate array (FPGA), an application specific integrated circuit (ASIC), a configurable processor (e.g., a microprocessor), or other element for performing a special purpose function alone (e.g., via hardware, such as circuitry) or by executing code tangibly stored on one or more volatile or non-volatile computer-readable media during execution or at other times. These computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like and/or may be located in the self tuning circuit or in a portion of the primary memory die 60 in which the self tuning circuit 104 is disposed.

In operation, the self tuning circuit 104 of the primary memory die 60, for example, is activated. Once activated, the self tuning circuit 104 measures the delays to the various secondary memory dies 62, determines the worst-case delay, and programs (e.g., initializes, configures, or otherwise sets up) each trim circuit 88 of the secondary memory dies 62 so that the secondary memory dies 62 have a consistent (e.g., the same) total delay by generating respective fixed delays caused by the respective trim circuits 88. This process can also be applied to the primary memory die 60 via the trim circuit 88 of the primary memory die 60. In this manner, the self tuning circuit 104 can operate to implement the process illustrated in the flow diagram 92 of FIG. 9.

In some embodiments, the self tuning circuit 104 can perform the above described memory stack 58 tuning operation during the manufacturing process. Additionally and/or alternatively, the self tuning circuit 104 can perform the above described memory stack 58 tuning operation upon startup (e.g., when a device housing the memory device is powered up). This may be beneficial in situations where, for example, the memory device can be operated at differing speeds (i.e., having differing data rates and/or clock frequencies). Thus, the self tuning circuit 104 can be used to trim the memory dies 60, 62 in view of the operating characteristics (e.g., clock frequencies) of the memory device 10.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a first memory die;
a second memory die directly coupled to the first memory die via a first bus; and
a second bus directly coupled to the first memory die and indirectly coupled to the second memory die, wherein the first memory die comprises a first trim circuit that when in operation adjusts a delay of signal transmission by the first memory die to a first value, wherein the second memory die comprises a second trim circuit that when in operation adjusts a delay of signal transmission by the second memory die to a second value, wherein the first memory die comprises a self tuning circuit that when in operation controls configuration of the second trim circuit of the second memory die.

2. The device of claim 1, wherein device comprises a third memory die directly coupled to the second memory die via the first bus.

3. The device of claim 2, wherein the third memory die is disposed on the second memory die and wherein the second memory die is disposed on the first memory die to form a memory stack.

4. The device of claim 1, wherein the second bus is coupled to a host device.

5. The device of claim 4, wherein the first memory die when in operation receives at least one signal from the host device via the second bus.

6. The device of claim 5, wherein the first memory die when in operation transmits the at least one signal to the second memory die via the first bus.

7. The device of claim 6, wherein the first memory die when in operation receives at least one second signal from the second memory die via the first bus.

8. The device of claim 7, wherein the first memory die when in operation transmits the at least one second signal to the host device via the second bus.

9. The device of claim 1, wherein the first value and an amount of time to complete a memory operation by the first memory die combine to be a net timing delay value.

10. The device of claim 9, wherein the second value and a second amount of time to complete the memory operation by the second memory die combine to be the net timing delay value.

11. The device of claim 1, wherein the self tuning circuit of the first memory die when in operation controls initialization of the first trim circuit.

12. A method, comprising:
    initiating a memory operation at a first memory die of a memory stack via a front end interface path directly coupled to the first memory die;
    determining a first amount of time to complete the memory operation;
    initiating the memory operation at a second memory die of the memory stack via the front end interface path indirectly coupled to the second memory die;
    determining a second amount of time to complete the memory operation;
    calibrating a first delay circuit of the first memory die to generate a first signal transmission delay in the first memory die when the first amount of time is less than the second amount of time; and
    calibrating a second delay circuit of the second memory die via a self tuning circuit disposed in the first memory die to generate a second signal transmission delay in the second memory die when the first amount of time is greater than the second amount of time.

13. The method of claim 12, wherein the first signal transmission delay in the first memory die is a user determined first value, wherein the second signal transmission delay in the second memory die is a user determined second value.

14. The method of claim 12, comprising automatically determining the first signal transmission delay in the first memory die and automatically determining the second signal transmission delay in the second memory die.

15. The method of claim 12, comprising calibrating the first delay circuit during manufacture of a package comprising the first memory die and calibrating the second delay circuit during the manufacture of the package comprising the second memory die.

16. The method of claim 12, comprising calibrating the first delay circuit and the second delay circuit at power up of a device comprising the first memory die and the second memory die.

17. A device, comprising:
    a first memory die comprising a first trim circuit that when in operation delays transmission of a signal by the first memory die by a first fixed amount, wherein the first memory die when in operation receives first operational signals from an external host directly coupled to the first memory die via a front end interface path; and
    a second memory die disposed directly on the first memory die, wherein the second memory die when in operation receives second operational signals indirectly from the external host via a direct coupling between the first memory die and the second die, wherein the direct coupling between the first memory die and the second die is separate from the front end interface path directly coupling the first memory die and the external host, wherein the second memory die comprises a second trim circuit that when in operation delays transmission of a second signal by the second memory die by a second fixed amount, wherein the first fixed amount and the second fixed amount equalize an amount of time used by the first memory die and the second memory die to complete a memory operation, wherein the first memory die comprises a self tuning circuit that when in operation calibrates the first trim circuit to delay transmission of the signal by the first memory die by the first fixed amount and when in operation calibrates the second trim circuit to delay transmission of the second signal by the second memory die by the second fixed amount.

18. The device of claim 17, wherein the first memory die when in operation transmits at least one signal, received from the external host, to the second memory die via a bus interconnecting the first memory die and the second memory die.

* * * * *